US012610566B2

(12) United States Patent
Wang et al.

(10) Patent No.: US 12,610,566 B2
(45) Date of Patent: Apr. 21, 2026

(54) SEMICONDUCTOR STRUCTURE AND METHOD OF FORMING THE SAME

(71) Applicant: Semiconductor Manufacturing International (Shanghai) Corporation, Shanghai (CN)

(72) Inventors: Xiaodong Wang, Shanghai (CN); Fei Tang, Shanghai (CN); Weihong Qian, Shanghai (CN); Xining Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 454 days.

(21) Appl. No.: 18/143,256

(22) Filed: May 4, 2023

(65) Prior Publication Data

US 2023/0361155 A1     Nov. 9, 2023

(30) Foreign Application Priority Data

May 9, 2022     (CN) .......................... 202210499358.8

(51) Int. Cl.
    *H10D 1/20*        (2025.01)
    *H01L 23/552*      (2006.01)
(52) U.S. Cl.
    CPC ..................................... *H10D 1/20* (2025.01)

(58) Field of Classification Search
    CPC ..... H10D 1/20; H01L 23/5227; H01L 23/552; H01L 23/645
    See application file for complete search history.

(56) References Cited

U.S. PATENT DOCUMENTS

| | | | | |
|---|---|---|---|---|
| 7,663,205 B2 * | 2/2010 | Chung | .................... | H10D 84/40 |
| | | | | 257/347 |
| 2019/0348422 A1 * | 11/2019 | Wang | .................... | H10D 84/853 |
| 2020/0035785 A1 * | 1/2020 | Singh | ..................... | H10D 30/60 |
| 2022/0270932 A1 * | 8/2022 | Kang | .................... | H10D 62/371 |

* cited by examiner

*Primary Examiner* — Omar F Mojaddedi
(74) *Attorney, Agent, or Firm* — Anova Law Group, PLLC

(57)            ABSTRACT

A semiconductor structure includes a substrate. The substrate includes a shielding region and a device region. The shielding region includes a first active region parallel to a first direction. The device region includes a second active region parallel to the first direction. The semiconductor structure also includes first isolation structures located on the shielding region. The first isolation structures run through the first active region along the second direction. The semiconductor structure also includes first gate structures located on the device region. The first gate structures cross the second active region along the second direction. The semiconductor structure also includes a second isolation structure located on the device region. The second isolation structure runs through the second active region along the second direction. The semiconductor structure also includes a dielectric layer on the substrate and an inductance coil on the dielectric layer.

10 Claims, 7 Drawing Sheets

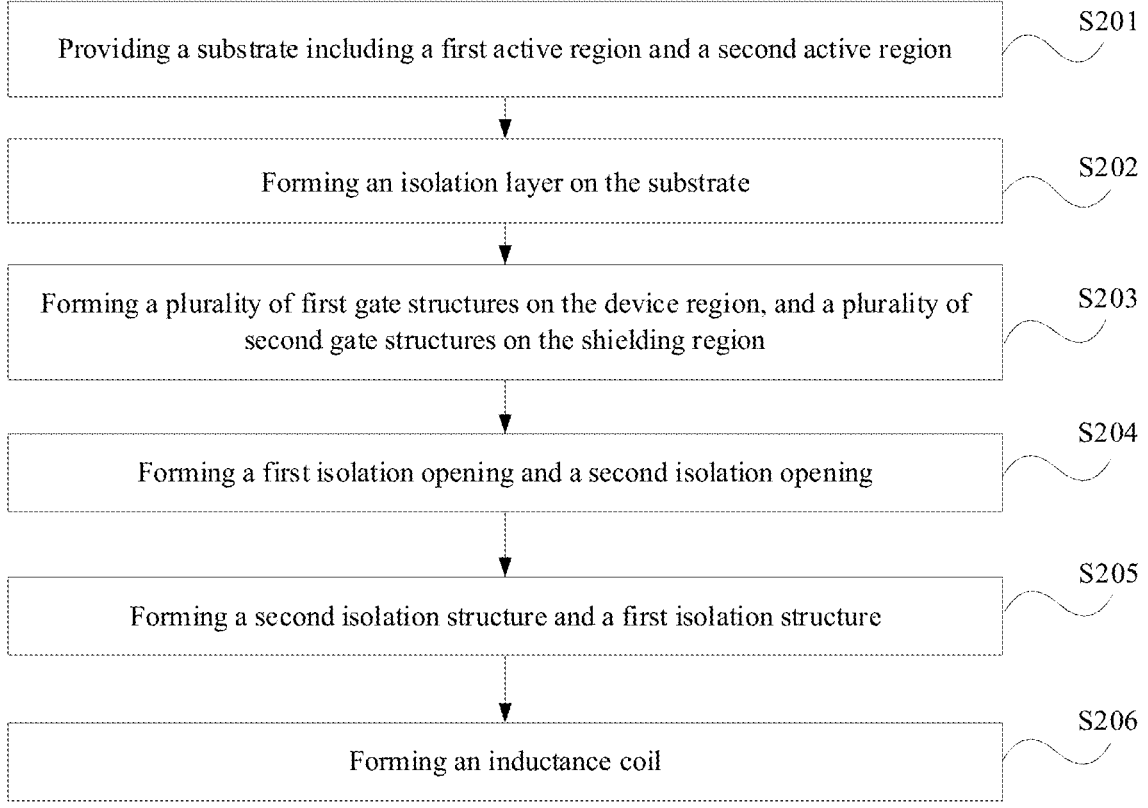

Providing a substrate including a first active region and a second active region    S201

Forming an isolation layer on the substrate    S202

Forming a plurality of first gate structures on the device region, and a plurality of second gate structures on the shielding region    S203

Forming a first isolation opening and a second isolation opening    S204

Forming a second isolation structure and a first isolation structure    S205

Forming an inductance coil    S206

Figure 13

SEMICONDUCTOR STRUCTURE AND METHOD OF FORMING THE SAME

CROSS-REFERENCE TO RELATED APPLICATION

This application claims priority of Chinese Patent Application No. 202210499358.8, filed on May 9, 2022, the entire content of which is hereby incorporated by reference.

FIELD OF THE DISCLOSURE

The present disclosure generally relates to the field of semiconductor technology and, more particularly, relates to a semiconductor structure and a method of forming the same.

BACKGROUND

An inductor is a component that may convert electrical energy into magnetic energy and store the magnetic energy. Inductors are widely used in radio-frequency devices, including low-noise amplifiers, voltage-controlled oscillators and so on.

A quality factor Q is a physical quantity that characterizes operation efficiency of an inductor. The quality factor Q of an inductor refers to a ratio of an inductive reactance of the inductor to an equivalent loss resistance of the inductor when the inductor operates at an AC voltage with a certain frequency. The higher the quality factor Q of an inductor, the smaller the loss of the inductor and the higher the efficiency of the inductor.

An inductance coil is a basic component of an inductor, and operates on the principle of electromagnetic induction. The quality factor Q of an inductor is related to DC resistance of a coil wire of the inductance coil. By reducing the resistance value of the inductance coil, the quality factor Q of the inductor may be improved.

However, there are some technical problems of inductors in existing technologies that need to be addressed.

BRIEF SUMMARY OF THE DISCLOSURE

One aspect of the present disclosure includes a semiconductor structure. The semiconductor structure includes a substrate. The substrate includes a shielding region and a device region. The shielding region includes a first active region parallel to a first direction, and the device region includes a second active region parallel to the first direction. The semiconductor structure also includes a plurality of first isolation structures located on the shielding region. The plurality of first isolation structures is parallel to a second direction, and the plurality of first isolation structures runs through the first active region along the second direction. The first direction is perpendicular to the second direction. The semiconductor structure also includes a plurality of first gate structures located on the device region. The plurality of the first gate structures is parallel to the second direction, and the plurality of first gate structures crosses the second active region along the second direction. The semiconductor structure also includes a second isolation structure located on the device region. The second isolation structure is parallel to the second direction, and the second isolation structure runs through the second active region along the second direction. The semiconductor structure also includes a dielectric layer located on the substrate. The dielectric layer covers sidewalls of the plurality of first isolation structures and the second isolation structure. The semiconductor structure also includes an inductance coil located on the dielectric layer. A projected image of the inductance coil on the substrate is located within the shielding region.

Optionally, the second isolation structure is located between part of adjacent first gate structures of the plurality of first gate structures.

Optionally, the dielectric layer also covers sidewalls of the second isolation structure and the plurality of first gate structures.

Optionally, the plurality of first isolation structures is made of a material including silicon oxide, silicon nitride, silicon oxynitride, or a combination thereof.

Optionally, the semiconductor structure also includes a plurality of second gate structures located on the shielding region. The plurality of second gate structures is parallel to the second direction, and the plurality of second gate structure crosses the first active region along the second direction.

Optionally, the inductance coil includes a first coil layer, a second coil layer, and a plurality of conductive plugs. The first coil layer and the second coil layer are connected in parallel through the plurality of conductive plugs.

Optionally, the first coil layer includes a first substructure and a second substructure that are separated from each other. The second coil layer includes a third substructure and a fourth substructure that are separated from each other. A projected image of the first substructure on the substrate is within a range of a projected image of the third substructure on the substrate. The projected image of the third substructure on the substrate and a projected image of the second substructure on the substrate have an overlapping portion. A projected image of the fourth substructure on the substrate is within a range of the projected image of the second substructure on the substrate.

Optionally, the first active region includes a fin structure or a planar structure.

Optionally, when the first active region includes a fin structure, the semiconductor structure also includes an isolation layer on the substrate. The isolation layer covers part of sidewalls of the first active region and the second active region, and a top surface of the isolation layer is lower than top surfaces of the first active region and the second active region.

Optionally, the second active region includes a fin structure or a planar structure.

Another aspect of the present disclosure includes a method of forming a semiconductor structure. The method includes providing a substrate. The substrate includes a shielding region, and the shielding region includes a first active region parallel to a first direction. The method also includes forming a dielectric layer and a plurality of first isolation structures on the substrate. The plurality of first isolation structures is located on the shielding region, the dielectric layer covers sidewalls of the plurality of first isolation structures, the plurality of the first isolation structures is parallel to a second direction, the plurality of first isolation structures runs through the first active region along the second direction, and the first direction is perpendicular to the second direction. The method also includes forming an inductance coil on the dielectric layer. A projected image of the inductance coil on the substrate is located in the shielding region.

Optionally, the substrate also includes a device region, and the device region includes a second active region parallel to the first direction. The method also includes forming a plurality of first gate structures on the device region. The plurality of the first gate structures is parallel to the second direction, the plurality of first gate structures crosses the second active region along the second direction, and the dielectric layer covers sidewalls of the first gate structures. The method also includes forming a first isolation opening in the dielectric layer by removing part of the plurality of first gate structures and part of the second active region. The first isolation opening is located between adjacent first gate structures of the plurality of first gate structures, and the first isolation opening runs through the second active region along the second direction. The method also includes forming the second isolation structure in the first isolation opening.

Optionally, the method also includes, when forming the plurality of first gate structures on the device region, forming a plurality of second gate structures on the shielding region. The plurality of second gate structures is parallel to the second direction, the plurality of second gate structures crosses the first active region along the second direction, and the dielectric layer covers sidewalls of the plurality of second gate structures.

Optionally, forming the plurality of first isolation structures includes, during a process of removing part of the plurality of first gate structures and part of the second active region, removing the plurality of second gate structures and part of the first active region, and forming a plurality of second isolation openings in the dielectric layer. The plurality of second isolation opening runs through the first active region along the second direction. The process also includes forming the plurality of first isolation structures in the plurality of second isolation opening.

Optionally, during the process of removing part of the plurality of first gate structures and part of the second active region, each of the plurality of second gate structures is removed, or part of the plurality of second gate structures is removed.

Optionally, the plurality of first isolation structure is made of a material including silicon oxide, silicon nitride, silicon oxynitride, or a combination thereof.

Optionally, the inductance coil includes a first coil layer, a second coil layer and a plurality of conductive plugs. The first coil layer and the second coil layer are connected in parallel through the plurality of conductive plugs.

Optionally, the first coil layer includes a first substructure and a second substructure that are separated from each other. The second coil layer includes a third substructure and a fourth substructure that are separated from each other. A projected image of the first substructure on the substrate is within a range of a projected image of the third substructure on the substrate. The projected image of the third substructure on the substrate and a projected image of the second substructure on the substrate have an overlapping portion. A projected image of the fourth substructure on the substrate is within a range of the projected image of the second substructure on the substrate.

Optionally, the first active region includes a fin structure or a planar structure.

Optionally, when the first active region includes a fin structure, the method also includes forming an isolation layer on the substrate. The isolation layer covers part of sidewalls of the first active region and the second active region, and a top surface of the isolation layer is lower than top surfaces of the first active region and the second active region.

Optionally, the second active region includes a fin structure or a planar structure.

As disclosed, the technical solutions of the present disclosure have the following advantages.

The semiconductor structure provided by the present disclosure includes a plurality of first isolation structures located on the shielding region. The plurality of the first isolation structures is parallel to a second direction. Along the second direction, the plurality of first isolation structures runs through the first active region. The first active region is parallel to a first direction. The first direction is perpendicular to the second direction. Since the first isolation structures run through the first active region, the first active region is fragmented, and the area of the first active region after fragmentation may thus be reduced. Accordingly, when the inductance coil is in operation, the eddy current induced in the first active region may be reduced. As such, the loss of the inductor may be reduced, and the quality factor Q of the inductor may thus be improved.

In the method of forming a semiconductor structure provided by the present disclosure, by forming a plurality of first isolation structures running through the first active region, the first active region is fragmented, and the area of the first active region after fragmentation may thus be reduced. Accordingly, when the inductance coil is in operation, the eddy current induced in the first active region may be reduced. As such, the loss of the inductor may be reduced, and the quality factor Q of the inductor may thus be improved.

Further, forming the first isolation includes, during a process of removing part of the first gate structures and part of the second active region, removing the second gate structure and part of the first active region, and forming a second isolation opening in the dielectric layer. The second isolation opening runs through the first active region along the second direction. The process also includes forming a first isolation structure in the second isolation opening. The first isolation structure is formed simultaneously when forming the second isolation structure in the device region by using a global manufacturing process. Accordingly, the process procedure may be simplified, and the process efficiency may be improved.

BRIEF DESCRIPTION OF THE DRAWINGS

The following drawings are merely examples for illustrative purposes according to various disclosed embodiments and are not intended to limit the scope of the present disclosure.

FIG. 13 illustrates a flowchart of an exemplary process of forming a semiconductor structure consistent with the disclosed embodiments of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

Figures 1, 2:
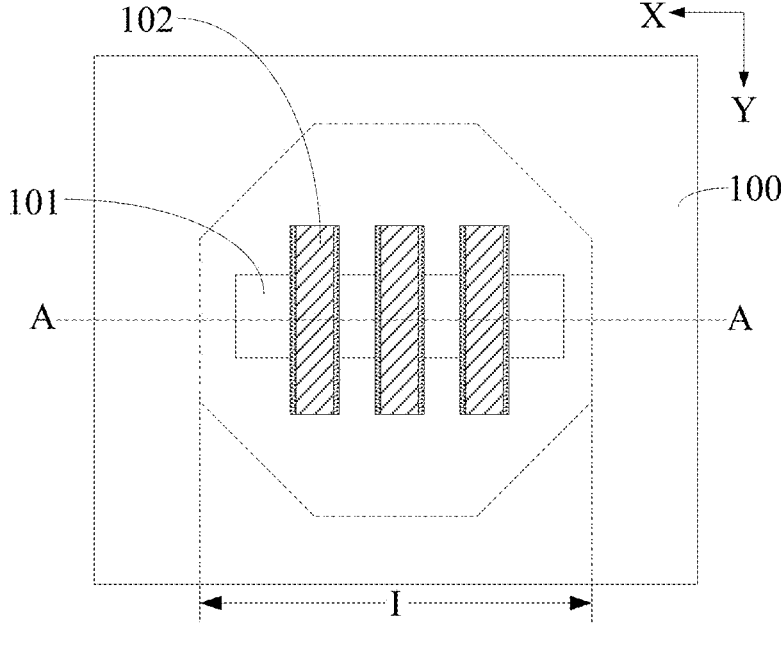
FIG. 1 and FIG. 2 illustrate schematic structural diagrams of an inductor.
Figure 3:
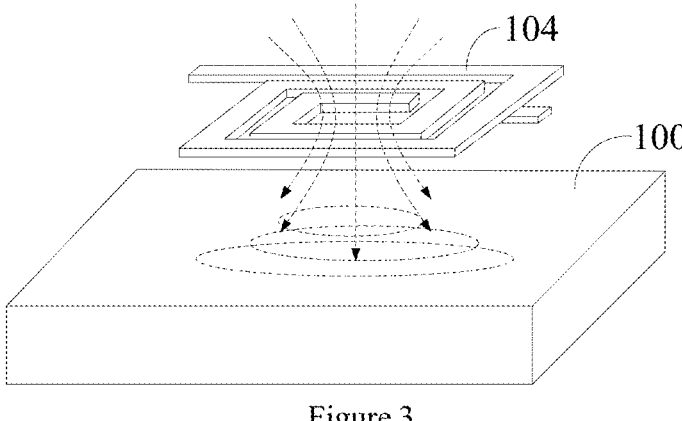
FIG. 3 illustrates a schematic diagram of eddy current induced in a substrate when an inductance coil is in operation.

Some technical problems of inductors in existing technologies are yet to be addressed. FIG. 1 and FIG. 2 illustrate schematic structural diagrams of an inductor. FIG. 1 illustrates a top view of an inductor with a dielectric layer and an inductance coil omitted. FIG. 2 illustrates a schematic cross-sectional view along line A-A in FIG. 1. FIG. 3 illustrates a schematic diagram of eddy current induced in a substrate when an inductance coil is in operation.

Referring to FIGS. 1 and 2, the inductor includes a substrate 100. The substrate 100 includes a shielding region I. The shielding region I includes an active area 101 parallel to a first direction X. The inductor also includes a plurality of gate structures 102 located on the shielding region I. The plurality of gate structures 102 is parallel to a second direction Y and crosses the active region 101 along the second direction Y. The first direction X is perpendicular to the second direction Y. The inductor also includes a dielectric layer 103 located on the substrate 100. The dielectric layer 103 covers sidewalls of the plurality of gate structures 102. The inductor also includes an inductance coil 104 located on the dielectric layer 103. The projected image of the inductance coil 104 on the substrate 100 is located within the shielding region I.

Referring to FIG. 3, in one example, the plurality of gate structures 102 in the shielding region I is formed simultaneously when forming a transistor structure in a device area (not shown) by using a global manufacturing process. Since the plurality of gate structure 102 only crosses the active region 101 without causing damage to the active region 101, an overall area of the active region 101 may be large. As a result, when the inductance coil 104 is in operation, a large eddy current may be induced in the active region 101, resulting in large loss, and the quality factor Q of the inductor may thus be decreased.

To address the above technical problems, the present disclosure provides a semiconductor structure and a forming method thereof. By forming a plurality of first isolation structures, running through the first active region, on the shielding region, the first active region may be fragmented, such that an area of the first active region after fragmentation may be reduced. Accordingly, when the inductance coil is in operation, the eddy current induced in the first active region may be reduced, the loss of the inductor may be reduced, and the quality factor Q of the inductor may be improved.

FIG. 13 illustrates a flowchart of an exemplary process of forming a semiconductor structure, consistent with the disclosed embodiments of the present disclosure. FIGS. 4 to 11 illustrate schematic structural diagrams corresponding to certain stages of an exemplary process of forming a semiconductor structure, consistent with the disclosed embodiments of the present disclosure.

Figure 4:
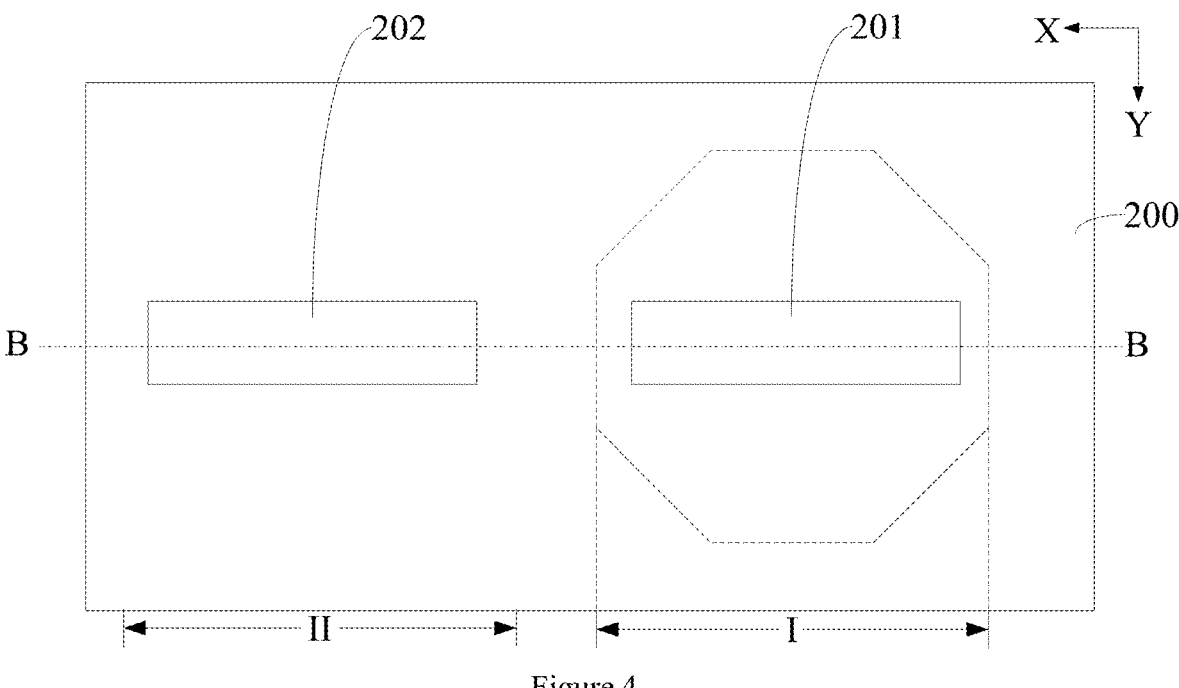
FIGS. 4 to 11 illustrate schematic structural diagrams corresponding to certain stages of an exemplary process of forming a semiconductor structure, consistent with the disclosed embodiments of the present disclosure.
Figure 5:
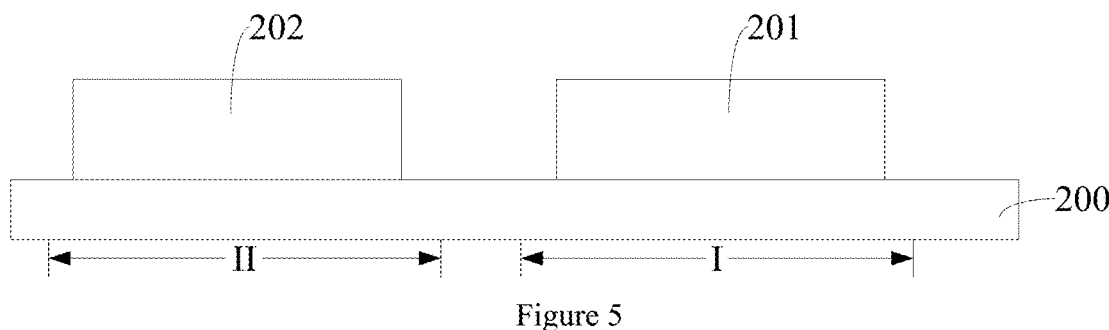

As shown in FIG. 13, at the beginning of the forming process, a substrate including a first active region and a second active region is provided (S201). FIGS. 4 and 5 illustrate a corresponding semiconductor structure. FIG. 5 is a schematic cross-sectional view along line B-B in FIG. 4.

Referring to FIGS. 4 and 5, a substrate 200 is provided. The substrate 200 includes a shielding region I. The shielding region I includes a first active region 201 parallel to a first direction X.

In one embodiment, the substrate 200 also includes a device region II. The device region II includes a second active region 202 parallel to the first direction X.

In one embodiment, the first active region 201 includes a fin structure, and the second active region 202 includes a fin structure.

In some other embodiments of the present disclosure, the first active region may include a planar structure, and the second active region may include a planar structure.

In one embodiment, a method of forming the substrate 200, the first active region 201 and the second active region 202 includes providing an initial substrate (not shown), and patterning the initial substrate to form the substrate 200, the first active region 201 and the second active region 202.

The substrate 200 is made of a material including silicon, silicon germanium, silicon carbide, silicon on insulator (SOI), germanium on insulator (GOI), or a combination thereof. Specifically, in one embodiment, the substrate 200 is made of a material including silicon. Correspondingly, the first active region 201 and the second active region 202 are also made of a material including silicon.

Figure 6:
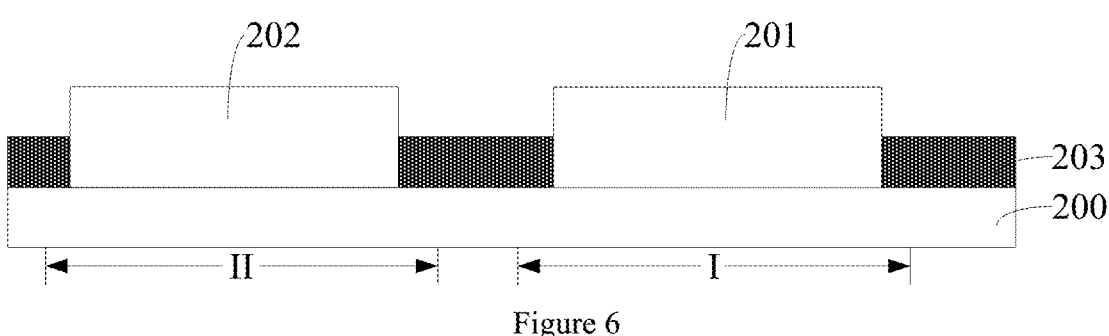

Returning to FIG. 13, after the substrate is provided, an isolation layer may be formed on the substrate (S202). FIG. 6 illustrates a corresponding semiconductor structure. FIG. 6 and FIG. 5 have a same view direction.

Referring to FIG. 6, an isolation layer 203 is formed on the substrate 200. In one embodiment, the first active region 201 and the second active region 202 each include a fin structure. Accordingly, the isolation layer 203 covers part of sidewalls of the first active region 201 and the second active region 202. A top surface of the isolation layer 203 is lower than the top surfaces of the first active region 201 and the second active region 202.

In one embodiment, a method of forming the isolation layer 203 includes forming a first isolation material film (not shown) on the substrate 200. The first isolation material film covers the first active region 201 and the second active region 202. The method of forming the isolation layer 203 also includes planarizing the first isolation material film until the top surfaces of the first active region 201 and the second active region 202 are exposed to form an initial isolation layer (not shown), and etching back the initial isolation layer to form the isolation layer 203. The isolation layer 203 covers part of sidewalls of the first active region 201 and the second active region 202. The top surface of the isolation layer 203 is lower than the top surfaces of the first active region 201 and the second active region 202.

In one embodiment, the isolation layer 203 is made of an insulating material including, for example, silicon oxide.

After forming the isolation layer 203, a dielectric layer and a plurality of first isolation structures may be formed on the substrate 200. The plurality of first isolation structures is located on the shielding region I, and the dielectric layer covers sidewalls of the plurality of first isolation structures. The plurality of the first isolation structures is parallel to a second direction Y, and the plurality of first isolation structures runs through the first active region 201 along the second direction Y. The first direction X is perpendicular to the second direction Y. For process details, reference may be made to FIGS. 7 to 10.

Figure 7:
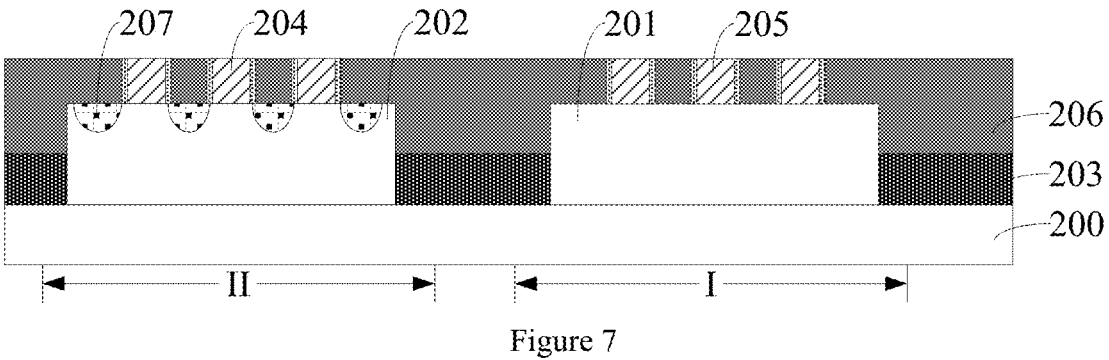

Returning to FIG. 13, after the isolation layer is formed, a plurality of first gate structures may be formed on the device region, and a plurality of second gate structures may be formed on the shielding region (S203). FIG. 7 illustrates a corresponding semiconductor structure.

Referring to FIG. 7, a plurality of first gate structures 204 is formed on the device region II. The plurality of the first gate structures 204 is parallel to the second direction Y. The plurality of first gate structures 204 crosses the second active region 202 along the second direction Y.

In one embodiment, when forming the plurality of first gate structures 204 on the device region II, a plurality of second gate structures 205 may be formed on the shielding region I. The plurality of second gate structures 205 is parallel to the second direction Y. The plurality of second gate structures 205 crosses the first active region 201 along the second direction Y.

In one embodiment, forming the plurality of first gate structures 204 and the plurality of second gate structures 205 includes forming a plurality of first dummy gate structures (not shown) on the device region II. The plurality of the first dummy gate structures is parallel to the second direction Y, and the plurality of first dummy gate structures crosses the second active region 202 along the second direction Y. The process also includes forming a plurality of second dummy gate structures (not shown) on the shielding region I. The plurality of the second dummy gate structures is parallel to the second direction Y, and the plurality of second dummy gate structures crosses the first active region 201 along the second direction Y. The process also includes forming a dielectric layer 206 on the substrate 200. The dielectric layer 206 covers sidewalls of the first dummy gate structure and the second dummy gate structure. The process also includes removing the first dummy gate structures and the second dummy gate structures, forming first gate openings and second gate openings (not shown) in the dielectric layer 206. The process also includes forming the first gate structures 204 in the first gate openings, and forming the second gate structure 205 in the second gate openings.

In one embodiment, the first dummy gate structure includes a first dummy gate portion and a first sidewall (not labelled) located on a sidewall of the first dummy gate portion. The second dummy gate structure includes a second dummy gate portion and a second sidewall (not labelled) located on a sidewall of the second dummy gate portion. When removing the first dummy gate structure and the second dummy gate structure, only the first dummy gate portion and the second dummy gate portion are removed. The first sidewall and the second sidewall are retained. A first gate portion is formed in the first gate opening, and the first gate structure 204 includes the first gate portion and the first sidewall. A second gate portion is formed in the second gate opening, and the second gate structure 205 includes the second gate portion and the second sidewall.

In one embodiment, before forming the first gate structure 204 and the second gate structure 205, the first dummy gate structure may be used as a mask to etch the second active region 202, forming a source/drain opening (not labelled) in the second active region 202 on two sides of the first dummy gate structure. A source-drain doped layer 207 may be formed in the source-drain/opening. Accordingly, a transistor structure may be formed by the source/drain doped layer 207, the first gate structure 204 and the second active region 202.

Figure 8:
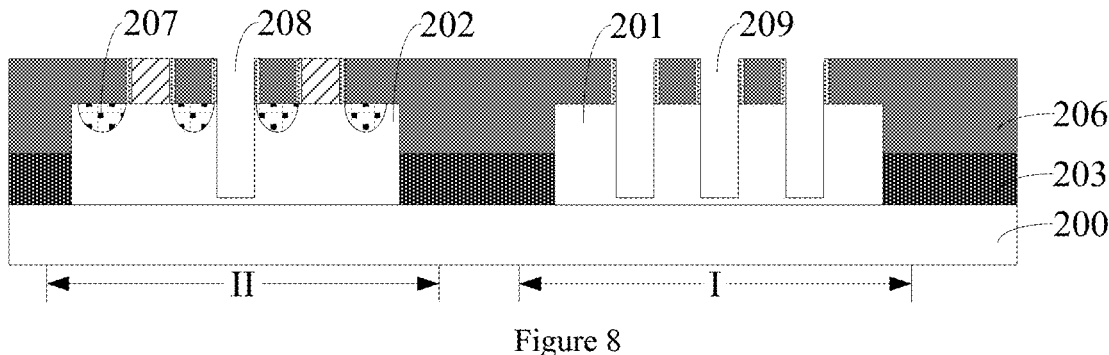

Returning to FIG. 13, after the plurality of first gate structures and the plurality of second gate structures are formed, a first isolation opening and a second isolation opening may be formed (S204). FIG. 8 illustrates a corresponding semiconductor structure.

Referring to FIG. 8, a first isolation opening 208 may be formed in the dielectric layer 206 by removing part of the first gate structures 204 and part of the second active region 202. The first isolation opening 208 is located between adjacent first gate structures 204. The first isolation opening 208 runs through the second active region 202 along the second direction Y.

In one embodiment, during a process of removing part of the first gate structures 204 and part of the second active region 202, the second gate structure 205 and part of the first active region 201 may be removed, forming a second isolation opening 209 in the dielectric layer 206. The second isolation opening 209 runs through the first active region 201 along the second direction Y.

In one embodiment, by introducing single diffusion break (SDB) technology, part of the first gate structures 204 and part of the second active region 202 may be removed to form the first isolation opening 208. Subsequently, a second isolation structure may be formed in the first isolation opening 208. The second isolation structure may prevent the source/drain doped layers 207 of different transistor structures from being connected to each other. In addition, an area of the second isolation structure may be reduced, and an integration level of the semiconductor structure formed may be improved.

During a process of forming a transistor in the device region II, a protection ring (not shown) may be formed on the substrate 200. The protection ring is located outside the shielding region I and surrounds the shielding region I. According to the global manufacturing process, a plurality of third active regions and third gate structures crossing the plurality of third active regions may also be disposed inside the protection ring.

In one embodiment, during a process of removing part of the first gate structures 204 and part of the second active region 202, the third gate structures and part of the third active region may be removed to form third isolation openings (not shown) in the dielectric layer 206. The third isolation openings run through the third active region along the second direction Y.

In one embodiment, during the process of removing part of the first gate structures 204 and part of the second active region 202, each of the second gate structures 205 is removed.

In some other embodiments, during the process of removing part of the first gate structures and part of the second active region, part of the second gate structures is removed.

It should be noted that, in one embodiment, a process of removing the first gate structure 204 and the second gate structure 205 specifically includes removing the first gate portion and the second gate portion, and retaining the first sidewall and the second sidewall.

Figure 9:
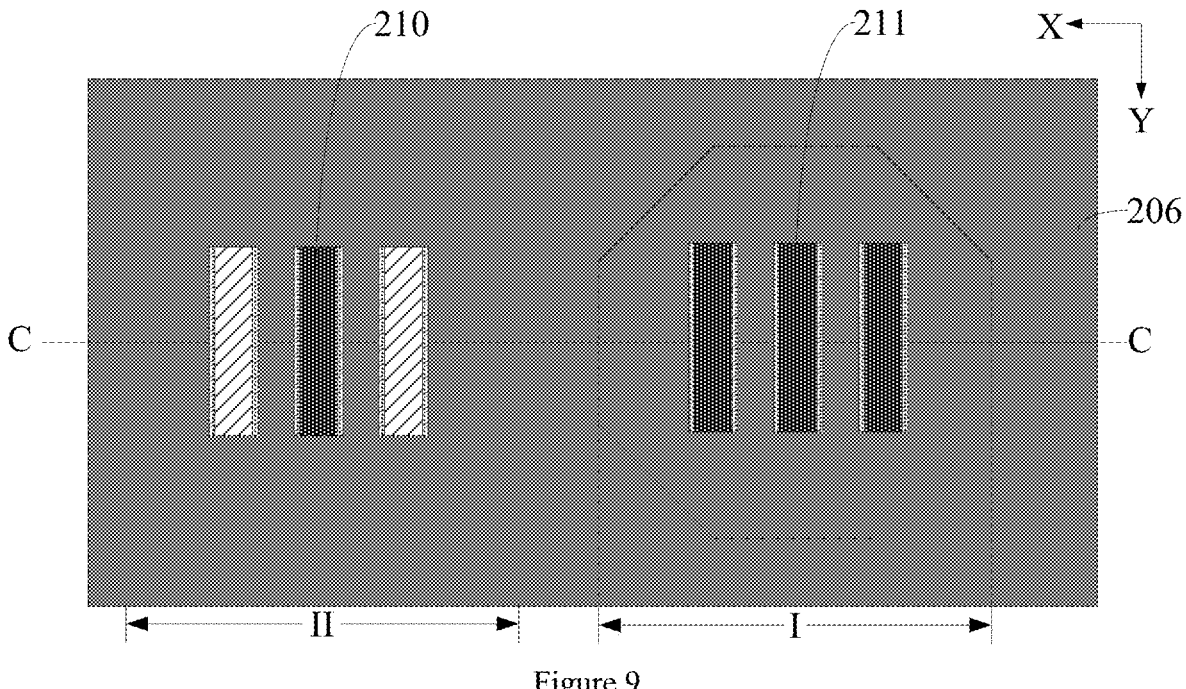
Figure 10:
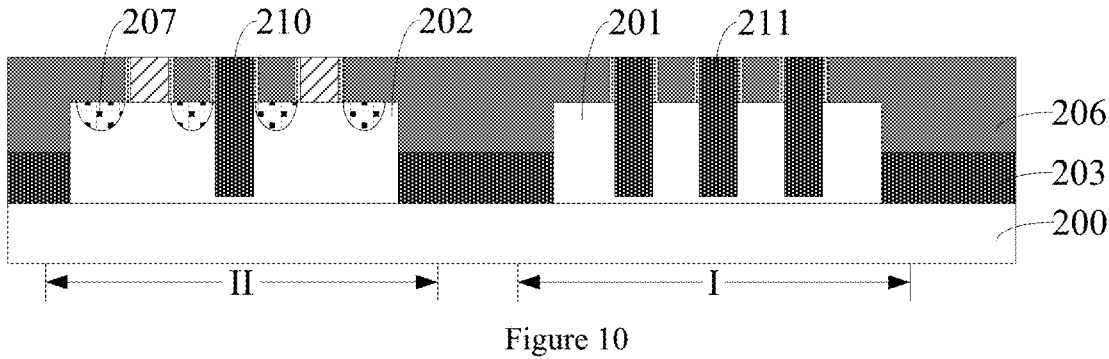

Returning to FIG. 13, after the first isolation opening and the second isolation opening are formed, a second isolation structure and a first isolation structure may be formed (S205). FIGS. 9 and 10 illustrate a corresponding semiconductor structure. FIG. 10 is a schematic cross-sectional view along line C-C in FIG. 9.

Referring to FIGS. 9 and 10, a second isolation structure 210 is formed in the first isolation opening 208.

In one embodiment, when forming the second isolation structure 210 in the first isolation opening 208, a first isolation structure 211 may be formed in the second isolation opening 209.

In one embodiment, when forming the second isolation structure 210 in the first isolation opening 208, a third isolation structure (not shown) may be formed in the third isolation opening.

In one embodiment, forming the first isolation structure 211 and the second isolation structure 210 includes forming a second isolation material film (not shown) in the first isolation opening 208, in the second isolation opening 209 and on the dielectric layer 206, and planarizing the second isolation material film until the top surface of the dielectric layer 206 is exposed to form the first isolation structure 211 and the second isolation structure 210.

The second isolation material film is made of a material including silicon oxide, silicon nitride, silicon oxynitride, or a combination thereof. In one embodiment, the second isolation material film is made of a material including silicon oxide. Correspondingly, the first isolation structure 211 and the second isolation structure 210 are made of a material including silicon oxide.

In one embodiment, a plurality of first isolation structures 211 is formed on the shielding region I, and the first isolation structures 211 runs through the first active region 201. As such, the first active region 201 is fragmented, and the area of the first active region 201 after fragmentation may thus be reduced. Accordingly, when the inductance coil is in operation, the eddy current induced in the first active region 201 may be reduced. As a result, the loss of the inductor may be reduced, and the quality factor Q of the inductor may thus be improved.

In one embodiment, the first isolation structure 211 is formed simultaneously when forming the second isolation structure 210 in the device region II by using a global manufacturing process. Accordingly, the process procedure may be simplified, and the process efficiency may be improved.

Figure 11:
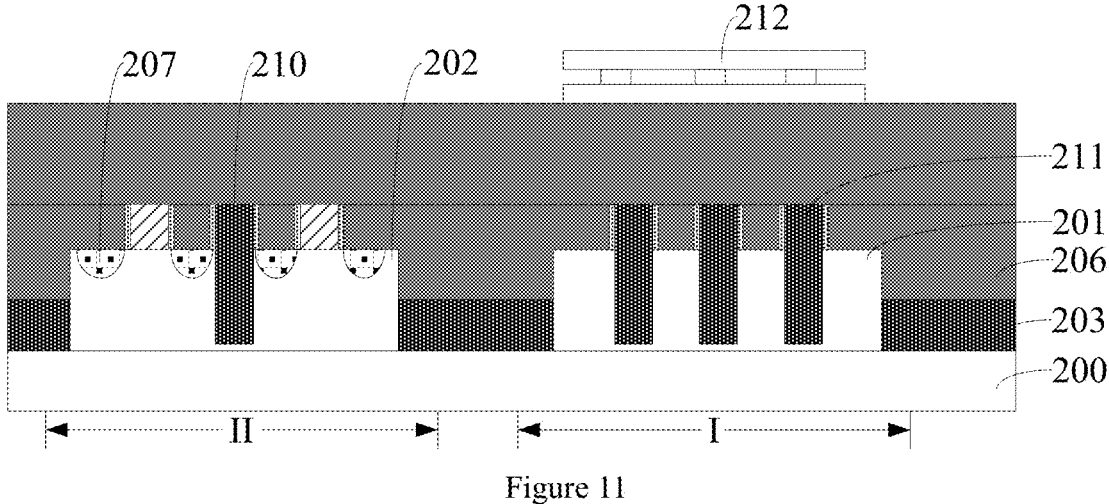

Returning to FIG. 13, after the second isolation structure and the first isolation structure are formed, an inductance coil may be formed on the dielectric layer (S206). FIG. 11 illustrates a corresponding semiconductor structure. View directions of FIGS. 11 and 10 are consistent.

Referring to FIG. 11, an inductance coil 212 is formed on the dielectric layer 206. A projected image of the inductance coil 212 on the substrate 200 is located within the shielding region I.

Figure 12:
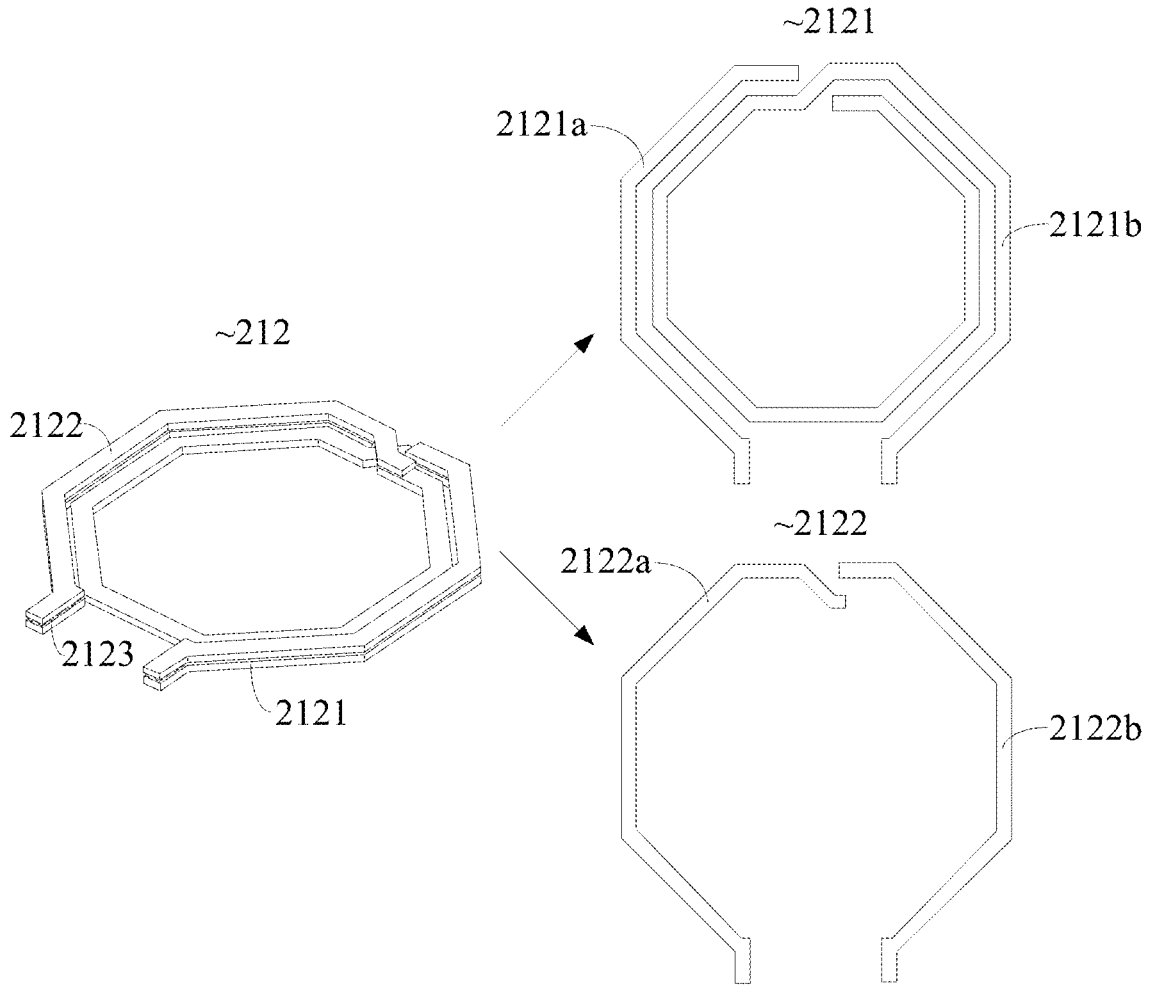
FIG. 12 illustrates a schematic structural diagram of an inductance coil consistent with the disclosed embodiments of the present disclosure.

FIG. 12 illustrates a schematic structural diagram of an inductance coil consistent with the disclosed embodiments of the present disclosure. Referring to FIG. 12, in one embodiment, the inductance coil 212 includes a first coil layer 2121, a second coil layer 2122 and a plurality of conductive plugs 2123. The first coil layer 2121 and the second coil layer 2122 are connected in parallel through the plurality of conductive plugs 2123.

In one embodiment, the first coil layer 2121 includes a first substructure 2121*a* and a second substructure 2121*b* that are separated from each other. The second coil layer 2122 includes a third substructure 2122*a* and a fourth substructure 2122*b* that are separated from each other. The projected image of the first substructure 2121*a* on the substrate 200 is within a range of the projected image of the third substructure 2122*a* on the substrate 200. Moreover, the projected image of the third substructure 2122*a* on the substrate 200 and the projected image of the second substructure 2121*b* on the substrate 200 have an overlapping portion. The projected image of the fourth substructure 2122*b* on the substrate 200 is in a range of the projected image of the second substructure 2121*b* on the substrate 200.

In one embodiment, before the inductance coil is formed, a plurality of electrical interconnection layers 213 may be formed on the dielectric layer 206 at the device region II. Since a global manufacturing process is used, a plurality of electrical interconnection layers 213 may be correspondingly formed on the dielectric layer 206 at the shielding region I.

The present disclosure also provides a semiconductor structure. Referring to FIG. 11, the semiconductor structure includes a substrate 200. The substrate 200 includes a shielding region I and a device region II. The shielding region I includes a first active region 201 parallel to a first direction X. The device region II includes a second active region 202 parallel to the first direction X. The semiconductor structure also includes a plurality of first isolation structures 211 located on the shielding region I. The plurality of first isolation structures 211 is parallel to a second direction Y. The plurality of first isolation structure 211 runs through the first active region 201 along the second direction Y. The first direction X is perpendicular to the second direction Y. The semiconductor structure also includes a plurality of first gate structures 204 located on the device region II. The plurality of the first gate structures 204 is parallel to the second direction Y. The plurality of first gate structures 204 crosses the second active region 202 along the second direction Y. The semiconductor structure also includes a second isolation structure 210 located on the device region II. The second isolation structure 210 is parallel to the second direction Y, and the second isolation structure 210 runs through the second active region 202 along the second direction Y. The semiconductor structure also includes a dielectric layer 206 located on the substrate 200. The dielectric layer 206 covers sidewalls of the first isolation structure 211 and the second isolation structure 210. The semiconductor structure also includes an inductance coil 212 located on the dielectric layer 206. A projected image of the inductance coil 212 on the substrate 200 is located in the shielding region I.

In one embodiment, since the first isolation structures 211 run through the first active region 201, the first active region 201 is fragmented, and the area of the first active region 201 after fragmentation may thus be reduced. Accordingly, when the inductance coil is in operation, the eddy current induced in the first active region 201 may be reduced. As such, the loss of the inductor may be reduced, and the quality factor Q of the inductor may thus be improved.

In one embodiment, the second isolation structure 210 is located between part of the adjacent first gate structures 204.

In one embodiment, the dielectric layer 206 also covers sidewalls of the second isolation structure 210 and the first gate structure 204.

The first isolation structure 211 is made of a material including silicon oxide, silicon nitride, silicon oxynitride, or a combination thereof. In one embodiment, the first isolation structure 211 is made of a material including silicon oxide.

In one embodiment, no second gate structures 205 are located on the shielding region I.

In some other embodiments of the present disclosure, the semiconductor structure also includes a plurality of second gate structures located on the shielding region. The plurality of second gate structures is parallel to the second direction. The second gate structure crosses the first active region along the second direction.

Referring to FIG. 12, in one embodiment, the inductance coil 212 includes a first coil layer 2121, a second coil layer 2122 and a plurality of conductive plugs 2123. The first coil layer 2121 and the second coil layer 2122 are connected in parallel through the plurality of conductive plugs 2123.

In one embodiment, the first coil layer 2121 includes a first substructure 2121a and a second substructure 2121b that are separated from each other. The second coil layer 2122 includes a third substructure 2122a and a fourth substructure 2122b that are separated from each other. The projected image of the first substructure 2121a on the substrate 200 is within a range of the projected image of the third substructure 2122a on the substrate 200. Moreover, the projected image of the third substructure 2122a on the substrate 200 and the projected image of the second substructure 2121b on the substrate 200 have an overlapping portion. The projected image of the fourth substructure 2122b on the substrate 200 is in a range of the projected image of the second substructure 2121b on the substrate 200.

In one embodiment, the first active region 201 includes a fin structure, and the second active region 202 includes a fin structure.

In some other embodiments of the present disclosure, the first active region may include a planar structure, and the second active region may include a planar structure.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A semiconductor structure, comprising:
a substrate, wherein the substrate includes a shielding region and a device region, wherein the shielding region includes a first active region parallel to a first direction, and the device region includes a second active region parallel to the first direction;
a plurality of first isolation structures located on the shielding region, wherein the plurality of first isolation structures is parallel to a second direction, and the plurality of first isolation structures runs through the first active region along the second direction, wherein the first direction is perpendicular to the second direction;
a plurality of first gate structures located on the device region, wherein the plurality of the first gate structures is parallel to the second direction, and the plurality of first gate structures crosses the second active region along the second direction;
a second isolation structure located on the device region, wherein the second isolation structure is parallel to the second direction, and the second isolation structure runs through the second active region along the second direction;
a dielectric layer located on the substrate, wherein the dielectric layer covers sidewalls of the plurality of first isolation structures and the second isolation structure; and
an inductance coil located on the dielectric layer, wherein a projected image of the inductance coil on the substrate is located within the shielding region.

2. The semiconductor structure according to claim 1, wherein:
the second isolation structure is located between part of adjacent first gate structures of the plurality of first gate structures.

3. The semiconductor structure according to claim 1, wherein:
the dielectric layer also covers sidewalls of the second isolation structure and the plurality of first gate structures.

4. The semiconductor structure according to claim 1, wherein:
the plurality of first isolation structures is made of a material including silicon oxide, silicon nitride, silicon oxynitride, or a combination thereof.

5. The semiconductor structure according to claim 1, further comprising:
a plurality of second gate structures located on the shielding region, wherein the plurality of second gate structures is parallel to the second direction, and the plurality of second gate structure crosses the first active region along the second direction.

6. The semiconductor structure according to claim 1, wherein:
the inductance coil includes a first coil layer, a second coil layer, and a plurality of conductive plugs, wherein the first coil layer and the second coil layer are connected in parallel through the plurality of conductive plugs.

7. The semiconductor structure according to claim 6, wherein:
the first coil layer includes a first substructure and a second substructure separated from the first substructure;
the second coil layer includes a third substructure and a fourth substructure separated from the third substructure;
a projected image of the first substructure on the substrate is within a range of a projected image of the third substructure on the substrate;
the projected image of the third substructure on the substrate and a projected image of the second substructure on the substrate have an overlapping portion; and
a projected image of the fourth substructure on the substrate is within a range of the projected image of the second substructure on the substrate.

8. The semiconductor structure according to claim 1, wherein:
the first active region includes a fin structure or a planar structure.

9. The semiconductor structure according to claim 8, when the first active region includes a fin structure, further comprising:
an isolation layer on the substrate, wherein the isolation layer covers part of sidewalls of the first active region and the second active region, and a top surface of the isolation layer is lower than top surfaces of the first active region and the second active region.

10. The semiconductor structure according to claim 1, wherein:
the second active region includes a fin structure or a planar structure.

* * * * *